(12) United States Patent
Nozaki et al.

(10) Patent No.: US 8,748,077 B2
(45) Date of Patent: Jun. 10, 2014

(54) RESIST PATTERN IMPROVING MATERIAL, METHOD FOR FORMING RESIST PATTERN, METHOD FOR PRODUCING SEMICONDUCTOR DEVICE, AND SEMICONDUCTOR DEVICE

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/358,892

(22) Filed: Jan. 26, 2012

(65) Prior Publication Data
US 2012/0228747 A1    Sep. 13, 2012

(30) Foreign Application Priority Data

Mar. 11, 2011    (JP) ................ 2011-054410

(51) Int. Cl.
G03F 7/004    (2006.01)
G03F 7/40    (2006.01)

(52) U.S. Cl.
USPC ........... 430/270.1; 430/273.1; 430/313; 430/314; 430/322; 430/324; 430/330; 430/331

(58) Field of Classification Search
USPC ........ 430/270.1, 273.1, 330, 331, 322, 313, 430/314, 317, 324
See application file for complete search history.

(56) References Cited

U.S. PATENT DOCUMENTS

| | | | |
|---|---|---|---|
| 6,555,607 B1 | 4/2003 | Kanda et al. | |
| 6,566,040 B1 | 5/2003 | Sugino et al. | |
| 6,579,657 B1 | 6/2003 | Ishibashi et al. | |
| 7,189,783 B2* | 3/2007 | Kozawa et al. | 525/61 |
| 7,198,888 B2 | 4/2007 | Endo et al. | |
| 7,416,837 B2 | 8/2008 | Nozaki et al. | |
| 7,439,171 B2* | 10/2008 | Soda et al. | 438/618 |
| 7,439,185 B2* | 10/2008 | Kojima | 438/700 |
| 7,465,527 B2 | 12/2008 | Kon et al. | |
| 7,538,038 B2* | 5/2009 | Matsushita et al. | 438/710 |
| 7,550,248 B2* | 6/2009 | Namiki et al. | 430/270.1 |
| 7,585,610 B2* | 9/2009 | Nozaki et al. | 430/270.1 |
| 7,591,270 B2 | 9/2009 | Zhang et al. | |
| 7,605,089 B2* | 10/2009 | Furukawa et al. | 438/708 |
| 7,744,768 B2* | 6/2010 | Kozawa et al. | 216/13 |

(Continued)

FOREIGN PATENT DOCUMENTS

| | | |
|---|---|---|
| CN | 1637600 A | 7/2005 |
| EP | 1429185 | 6/2004 |

(Continued)

OTHER PUBLICATIONS

Machine translation of JP 2005-294354 (no date).*

(Continued)

*Primary Examiner* — Amanda C. Walke
(74) *Attorney, Agent, or Firm* — Fujitsu Patent Center (57) ABSTRACT

To provide a resist pattern improving material, containing: water; and benzalkonium chloride represented by the following general formula (1):

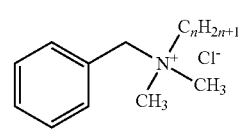

General Formula (1)

where n is an integer of 8 to 18.

6 Claims, 5 Drawing Sheets

(56) References Cited

U.S. PATENT DOCUMENTS

| | | | |
|---|---|---|---|
| 8,367,312 B2 * | 2/2013 | Sawada et al. | 430/325 |
| 2003/0175624 A1 | 9/2003 | Nozaki et al. | |
| 2004/0029047 A1 | 2/2004 | Ishibashi et al. | |
| 2004/0072098 A1 | 4/2004 | Kozawa et al. | |
| 2007/0010412 A1 | 1/2007 | Zhang et al. | |
| 2010/0003468 A1 | 1/2010 | Noya et al. | |
| 2010/0304313 A1 | 12/2010 | Zhang et al. | |

FOREIGN PATENT DOCUMENTS

| | | |
|---|---|---|
| JP | 62-065326 | 3/1987 |
| JP | 5-197151 | 8/1993 |
| JP | 11-204399 A | 7/1997 |
| JP | 9-260265 A | 10/1997 |
| JP | 10-073927 | 3/1998 |
| JP | 11-283910 A | 10/1999 |
| JP | 2000-058506 A | 2/2000 |
| JP | 2000-267268 A | 9/2000 |
| JP | 2000-298356 A | 10/2000 |
| JP | 2000-347414 A | 12/2000 |
| JP | 2001-19860 A | 1/2001 |
| JP | 2001-033984 A | 2/2001 |
| JP | 2001-228616 A | 8/2001 |
| JP | 3237082 | 12/2001 |
| JP | 2002-006491 A | 1/2002 |
| JP | 2002-006498 | 1/2002 |
| JP | 2002-006512 A | 1/2002 |
| JP | 2002-23366 A | 1/2002 |
| JP | 2002-049161 A | 2/2002 |
| JP | 2003-084457 A | 3/2003 |
| JP | 2003-131400 A | 5/2003 |
| JP | 2003-162060 | 6/2003 |
| JP | 2003-255564 A | 9/2003 |
| JP | 2004-053723 A | 2/2004 |
| JP | 2004-86203 A | 3/2004 |
| JP | 2004-126080 A | 4/2004 |
| JP | 2004-264373 A | 9/2004 |
| JP | 3633595 | 1/2005 |
| JP | 2005-091415 A | 4/2005 |
| JP | 2005-181850 A | 7/2005 |
| JP | 2005-208365 | 8/2005 |
| JP | 2005-294354 A | 10/2005 |
| JP | 2006-201809 A | 8/2006 |
| JP | 2006-259692 A | 9/2006 |
| JP | 2007-213013 A | 8/2007 |
| JP | 2008-3323 A | 1/2008 |
| JP | 2010-49247 A | 3/2010 |
| WO | WO-2004/074941 | 9/2004 |
| WO | WO 2007080726 A1 * | 7/2007 |

OTHER PUBLICATIONS

Chinese Office Action mailed Apr. 26, 2013 for corresponding Chinese Application No. 201210020305.X, with English-language Translation.

Ishibashi, Takeo "Advanced Micro-Lithography Process with Chemical Shrink Technology", Jpn. J. Appl. Phys., vol. 40; Sep. 21, 2000, pp. 419-425.

Terai, Mamoru "Below 70-nm Contact Hole Pattern with RELACS Process on ArF Resist", Proc. of SPIE, vol. 5039; 2003, pp. 789-797.

Korean Office Action mailed Aug. 29, 2013 for corresponding Korean Application No. 10-2012-8560, with English-language Translation.

* cited by examiner

FIG. 1A

Mixing

FIG. 1B

Penetrating and Reacting

RESIST PATTERN IMPROVING MATERIAL, METHOD FOR FORMING RESIST PATTERN, METHOD FOR PRODUCING SEMICONDUCTOR DEVICE, AND SEMICONDUCTOR DEVICE

CROSS-REFERENCE TO RELATED APPLICATIONS

This application is based upon and claims the benefit of priority of the prior Japanese Patent Application No. 2011-054410, filed on Mar. 11, 2011, the entire contents of which are incorporated herein by reference.

FIELD

The embodiments discussed herein relate to a resist pattern improving material, a method for forming a resist pattern, a method for producing a semiconductor device, and a semiconductor device.

BACKGROUND

To further improve integration degrees of semiconductors such as of a large scale integration (LSI), it is desired to make finer patterns during productions of semiconductors, and currently the smallest pattern size is 100 nm or shorter.

Formations of such fine patterns in semiconductor devices have been realized by shortening wavelength of light from a light source of exposure devices and improving resist materials. Currently, formations of fine patterns have been performed by a liquid immersion lithography, in which exposure is performed through water with a light source that emits argon fluoride (ArF) excimer laser light having a wavelength of 193 nm, and as a resist material used for the lithography, various ArF resist materials, which use acrylic resins as a base, have been developed. Moreover, as a lithography technique of the next generation, extreme ultraviolet (EUV) lithography using as a light source, soft X rays having a wavelength of 13.5 nm has been studied, and therefore it is obvious that a pattern size will continue to be reduced, e.g. 30 nm or shorter, in the future.

Along with the above-mentioned reduction of the pattern size, roughness of side walls of a resist pattern, i.e. line edge roughness (LER), and unevenness of a resist pattern line width, i.e. line width roughness (LWR) of the resist pattern have become more significant, which bring concerns that these defects may adversely affect performances of a resulting device. Although various studies have been conducted to inhibit LER and LWR of a resist pattern by optimizing an exposure device, a resist material, and process condition, sufficient results have not been achieved. Note that, the LWR and the LER are related to each other. The LER is improved, as the LWR is improved.

As a method for solving the aforementioned problem, for example, the method of improving LWR and LER is disclosed, and in this method, a resist pattern is treated with an aqueous solution containing an ionic surfactant in a rinsing process, which is performed after a developing process, so as to dissolve the roughness of the resist pattern at the same time as reducing defects (e.g. defects including residues, and deformation of the pattern) caused by the developing process (Japanese Patent Application Laid-Open (JP-A) No. 2007-213013).

Moreover, another method is disclosed in JP-A No. 2010-49247, and in this method an organic coating material, to which a low molecular acidic compound containing a carboxyl group, is applied to a resist pattern that has been developed, and the coating material is then removed to thereby reduce LWR and LER as well as sliming the resist pattern (see JP-A No. 2010-49247).

However, these proposed methods have a possibility to significantly increase values of the LWR, and LER, i.e., significantly increase unevenness or roughness of a resist pattern.

The present inventors have disclosed a resist pattern thickening material that enables precise processing by swelling (thickening) the resist pattern (Japanese Patent (JP-B) No. 3633595, and JP-A No. 2006-259692). In the case where a resist pattern is subjected to a thickening process using such resist pattern thickening material, however, a size of the resist pattern is largely changed. Therefore, it is not suitable for a material for improving LWR, which desirably improves LWR of a resist pattern, without changing a size of the resist pattern more than necessary.

As described above, the techniques of the conventional art have problems that a desirable size of a resist pattern cannot be obtained even though the LWR, and LER are improved, or the values of the LWR, and the LER may be significantly increased, i.e. roughness or unevenness of a resist pattern may be significantly increased.

As a similar method, a resist pattern forming method is disclosed (see JP-A No. 2005-294354), and in this method, after developing, a resist pattern is treated with an aqueous solution containing a certain surfactant, as a rinsing fluid to thereby prevent the resist pattern from falling, but nothing is disclosed about improvements of the LWR, and LER.

Accordingly, it is currently desired to provide a resist pattern improving material that can reduce LWR of a resist pattern without changing a size thereof more than necessary, a method for forming a resist pattern and a method for producing a semiconductor device using the aforementioned resist pattern improving material, and a semiconductor device produced by the aforementioned method for producing a semiconductor device.

SUMMARY

The disclosed resist pattern improving material contains:
water; and
benzalkonium chloride represented by the following general formula (1):

General Formula (1)

where n is an integer of 8 to 18.

The disclosed method for forming a resist pattern contains:
applying the disclosed resist pattern improving material so as to cover a surface of a resist pattern;
heating the applied resist pattern improving material and the resist pattern; and
rinsing the heated resist pattern improving material and the resist pattern with a rinsing fluid containing water,
wherein the resist pattern is formed by applying a resist material to a processing surface, exposing the applied resist material to light, and developing the exposed resist pattern to pattern the resist material.

The disclosed method for producing a semiconductor device contains:
applying the disclosed resist pattern improving material so as to cover a surface of a resist pattern;
heating the applied resist pattern improving material and the resist pattern;
rinsing the heated resist pattern improving material and the resist pattern with a rinsing fluid containing water to form the improved resist pattern; and
etching the processing surface using the improved resist pattern as a mask to pattern the processing surface,
wherein the resist pattern is formed by applying a resist material to a processing surface, exposing the applied resist material to light, and developing the exposed resist pattern to pattern the resist material.

The disclosed semiconductor device is produced by the disclosed method for producing a semiconductor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Resist Pattern Improving Material

The resist pattern improving material contains at least water and benzalkonium chloride represented by the general formula (1), and may further contain other components, such as a water-soluble resin, and a surfactant, if necessary.

In the present specification, "resist pattern improving" means an improvement of unevenness (LWR) of a resist pattern.

<Benzalkonium Chloride Represented by General Formula (1)>

The benzalkonium chloride used in the disclosed resist pattern improving material is represented by the following general formula (1).

General Formula (1)

In the general formula (1), n is an integer of 8 to 18.

The benzalkonium chloride represented by the general formula (1) is generally on a market as a mixture of molecules thereof in which n is in the range of 8 to 18.

An amount of the benzalkonium chloride represented by the general formula (1) is appropriately selected depending on the intended purpose without any restriction, but it is preferably 0.001 parts by mass to 10 parts by mass, more preferably 0.01 parts by mass to 5 parts by mass, and even more preferably 0.05 parts by mass to 0.5 parts by mass, relative to 100 parts by mass of water. When the amount of the benzalkonium chloride is smaller than 0.001 parts by mass relative to 100 parts by mass of the water, the effect of improving the LWR may not be sufficiently exhibited. When the amount thereof is larger than 10 parts by mass, the resist pattern improving material may dissolve the resist pattern when applied onto the resist pattern, which may lead to the deformation of the resist pattern. When the amount of the benzalkonium chloride is in the aforementioned even more preferable range, conversely, the roughness of side walls of a resist pattern can be reduced within a desirable pattern size range, and unevenness (LWR) of widths of a resist pattern is improved. Therefore, the resist pattern improving material containing such amount of the benzalkonium chloride is advantageous.

<Water>

The water is appropriately selected depending on the intended purpose without any restriction, but it is preferably pure water (deionized water).

An amount of the water is appropriately adjusted depending on the intended purpose without any restriction, but it is preferably 80 parts by mass or larger, more preferably 90 parts by mass or larger, relative to 100 parts by mass of the resist pattern improving material, for obtaining the desirable coating ability.

<Water-Soluble Resin>

The water-soluble resin is appropriately selected depending on the intended purpose without any restriction. Examples thereof include polyvinyl alcohol, polyvinyl pyrrolidone, polyglutamic acid, polyvinyl acetal, polyvinyl acetate, polyacrylic acid, polyethylene imine, polyethylene oxide, a styrene-maleic acid copolymer, polyvinyl amine, polyallyl amine, an oxazoline group-containing water-soluble resin, a water-soluble melamine resin, a water-soluble urea resin, an alkyd resin, a sulfone amide resin, cellulose, tannin, and resins containing any of the foregoing resins at least in part thereof. These may be used independently or in combination.

Among them, polyvinyl alcohol, polyvinyl pyrrolidone, polyglutamic acid, and the resins containing any of the foregoing resins at least in part thereof are preferable in view of their stability.

The water solubility of the water-soluble resin is appropriately adjusted depending on the intended purpose. For example, such the water solubility is preferable that 0.1 g or more of the water-soluble resin is dissolved in 100 g of water at 25° C.

An amount of the water-soluble resin is appropriately adjusted depending on the intended purpose without any restriction, but it is preferably 10 parts by mass or smaller, more preferably 4 parts by mass or smaller, relative to 100 parts by mass of the water. When the amount of the water-soluble resin is larger than 10 parts by mass, although the resulting resist pattern improving material improves the LWR, the effect of thickening a resist pattern is excessively large, and therefore a resist pattern of the desired size may not be obtained. When the amount of the water-soluble resin is within the more preferable range mentioned above, the resulting resist pattern improving material can reduce roughness of side walls of a resist pattern with thickening the resist pattern within a desirable range, without excessively changing the size of the resist pattern to thereby improve the evenness of the resist pattern width (i.e. improving LWR). Note that, the lowest limit of the amount of the water-soluble resin is appropriately selected depending on the intended purpose without any restriction, but it is preferably 0.001 parts by mass or larger relative to 100 parts by mass of the water.

<Surfactant>

The surfactant is appropriately selected depending on the intended purpose without any restriction. Examples thereof include a nonionic surfactant, a cationic surfactant, an anionic surfactant, and an amphoteric surfactant. These may be used independently, or in combination. Among them, the nonionic surfactant is preferable because it does not contain a metal ion such as a sodium salt, and potassium salt.

The nonionic surfactant is appropriately selected depending on the intended purpose without any restriction. Examples of thereof include an alkoxylate-based surfactant, a fatty acid ester-based surfactant, an amide-based surfactant, an alcohol-based surfactant, and an ethylene diamine-based surfactant. Specific examples of the nonionic surfactant include a polyoxyethylene-polyoxypropylene condensate product, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, a phenol ethoxylate compound, a nonylphenol ethoxylate-based compound, an octylphenol ethoxylate-based compound, a lauryl alcohol ethoxylate-based compound, an oleyl alcohol ethoxylate-based compound, a fatty acid ester-based compound, an amide-based compound, a natural alcohol-based compound, an ethylene diamine-based compound, and a secondary alcohol ethoxylate-based compound.

An amount of the surfactant is appropriately selected depending on types or amounts of the benzalkonium chloride, the water-soluble resin, or the like, without any restriction. The amount of the surfactant is preferably 2 parts by mass or smaller relative to 100 parts by mass of the water. When the amount of the surfactant is larger than 2 parts by mass, the surfactant may be precipitated during coating, or it is likely to cause defects on a pattern.

<Other Substances>

Other substances are appropriately selected depending on the intended purpose without any restriction, and examples thereof include an organic solvent, and various additives known in the art (e.g. various phase transfer catalysts, such as amines, amides, and ammonium chloride).

Each amount of other substances is not particularly restricted, and is appropriately adjusted depending on the types, or amounts of the benzalkonium chloride represented by the general formula (1), and the water-soluble resin.

—Organic Solvent—

The organic solvent is appropriately selected depending on the intended purpose without any restriction, and examples thereof include an alcohol organic solvent, a chain ester organic solvent, a cyclic ester organic solvent, a ketone organic solvent, a chain ether organic solvent, and a cyclic ether organic solvent.

The alcohol organic solvent is appropriately selected depending on the intended purpose without any restriction, and examples thereof include methanol, ethanol, propyl alcohol, isopropyl alcohol, and butyl alcohol.

The chain ester organic solvent is appropriately selected depending on the intended purpose without any restriction, and examples thereof include ethyl lactate.

The cyclic ester organic solvent is appropriately selected depending on the intended purpose without any restriction, and examples thereof include a lactone organic solvent such as γ-butyrolactone.

The ketone organic solvent is appropriately selected depending on the intended purpose without any restriction, and examples thereof include a ketone organic solvent such as acetone, cyclohexanone, and heptanone.

The chain ether organic solvent is appropriately selected depending on the intended purpose without any restriction, and examples thereof include ethylene glycol dimethyl ether, and propylene glycol monomethyl ether.

The cyclic ether organic solvent is appropriately selected depending on the intended purpose without any restriction, and examples thereof include tetrahydrofuran, and dioxane.

These organic solvents may be used independently, or in combination.

Among them, the organic solvents having the boiling point of 80° C. to 200° C. are preferable as they contribute to the effective reduction in roughness of a resist pattern.

Use of the organic solvent improve the solubility of the benzalkonium chloride represented by the general formula (1) and the water-soluble resin against the resist pattern improving material is improved, or gives antiseptic effects to the resulting resist pattern improving material.

The form of the resist pattern improving material is appropriately selected depending on the intended purpose without any restriction, and examples thereof include an aqueous solution, a colloid solution, and an emulsion. Among them, the aqueous solution is preferable in view of its coating ability.

<Use and the Like>

The resist pattern improving material can be used by applying the resist pattern improving material to a resist pattern.

The resist pattern improving material is applied onto the resist pattern so as to allow the resist pattern improving material to interact (mix) with the resist pattern, and as a result, a layer (a mixing layer) formed by the interaction between the resist pattern improving material and the resist pattern is formed at the surface of the resist pattern. The formation of the mixing layer reduces the roughness of the side walls of the resist pattern, so that a resist pattern whose LWR has been improved is formed.

Since the benzalkonium chloride represented by the general formula (1) is generally formed of a mixture of molecules including alkyl groups having a plurality of carbon numbers, i.e., n is 8 to 18, the resist pattern improving material is easily widely matched to the properties of the resist material forming the resist pattern, and is easily penetrated into the resist pattern, so that the resist pattern improving material have an effect of reducing the roughness of side walls of the resist pattern.

As a result of the reduction in the roughness of the side walls of the resist pattern with the resist pattern improving material, the uniformity of the line width of the resist pattern is improved compared with that before the reduction of the roughness, i.e., unevenness of the line width of the resist pattern (line width roughness (LWR)) is improved. As a result of the improved LWR, a highly precise resist pattern is formed by extending the exposure limit (dissolution limit) of a light source of an exposure device used for the patterning of the resist pattern (smaller than the size of the opening and/or pattern pitch which can be patterned by a wavelength of the light of the light source).

Moreover, in the case where the resist pattern improving material contains the benzalkonium chloride represented by the general formula (1), such the resist pattern improving material thickens a resist pattern at the same time as reducing the roughness of the side walls of the resist pattern. By thickening the resist pattern, the roughness of the side walls of the resist pattern is reduced even more.

The reduction rate of the roughness of the side walls of the resist pattern, uniformity of the width of the resist pattern, and thickened amount of the resist pattern can be controlled in the desirable ranges by appropriately adjusting the amount of the benzalkonium chloride represented by the general formula (1) for use in the resist pattern improving material, as well as the viscosity, applied thickness, baking temperature, and baking duration of the resist pattern improving material, and the like.

—Material of Resist Pattern (Resist Material)—

The material of the resist pattern (i.e. a resist pattern to which the resist pattern improving material is applied) is appropriately selected from resist materials known in the art depending on the intended purpose without any restriction, and it may be any of negative or positive. Examples thereof include resists that can be patterned by g-line, i-line, KrF excimer laser light, ArF excimer laser light, $F_2$ excimer laser light, an electron beam and the like, such as a g-line resist, an i-line resist, a KrF resist, an ArF resist, a $F_2$ resist, an electron beam resist, and the like. These may be of chemically amplified, or of non-chemically amplified. Among them, a KrF resist, an ArF resist, a resist containing an acrylic resin are preferable. In view of the formation of finer patterns, and improvement of through-put, the ArF resist, the resolution limit of which have been desired to extend urgently, and/or the resist containing an acrylic resin are more preferable as the material of the resist pattern.

Specific examples of the material for the resist pattern include a novolak-based resist, a PHS-based resist, a PHS-acryl copolymer based resist, an acryl-based resist, a cycloolefin-maleic acid anhydride (COMA)-based resist, a cycloolefin-based resist, and a hybrid (alicyclic acryl-COMA copolymer) resist. These may be fluorine-modified, or modified in other manners.

The formation method, size, thickness, and the like of the resist pattern are appropriately selected depending on the intended purpose without any restriction. Especially, the thickness of the resist pattern is appropriately adjusted depending on the processing surface (which is a subject for the process), the etching conditions, and the like, but it is generally approximately 50 nm to approximately 500 nm.

Hereinafter, the manner of reducing the roughness of side walls of the resist pattern using the resist pattern improving material will be explained with reference to the drawings.

Figure 1A:
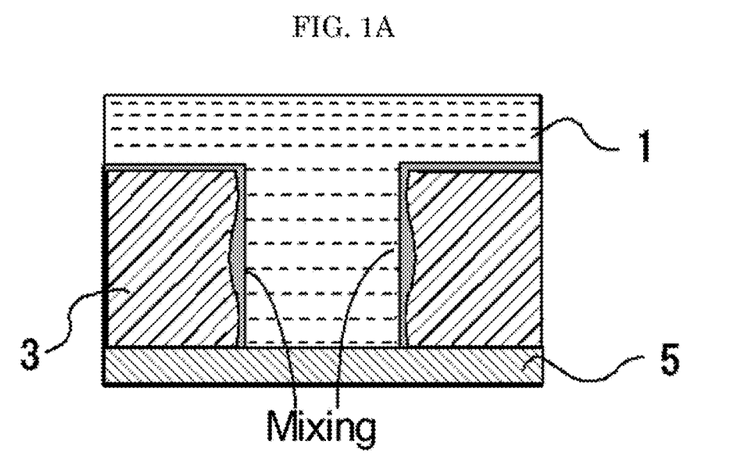
FIG. 1A is a diagram for explaining a mechanism for improving (reducing) LWR of a resist pattern using the disclosed resist pattern improving material, and illustrates the state where the resist pattern improving material is applied to a surface of the resist pattern.
Figure 1B:
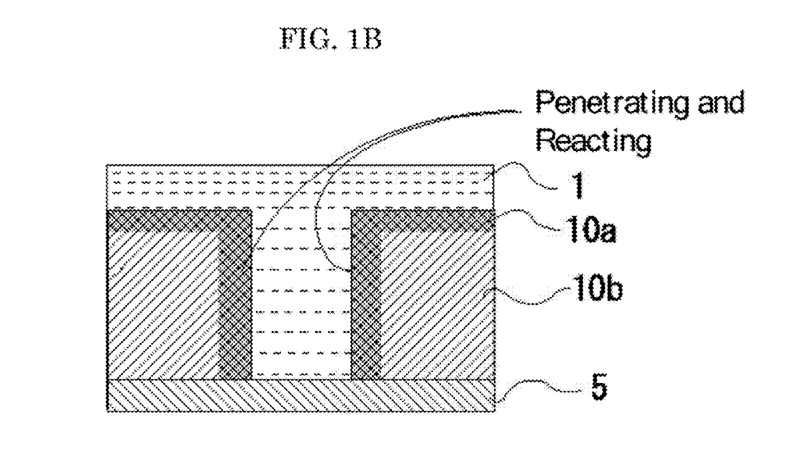
FIG. 1B is a diagram for explaining a mechanism for improving (reducing) LWR of a resist pattern using the disclosed resist pattern improving material, and illustrates the state where the resist pattern improving material is penetrated into the surface of the resist pattern.

As illustrated in FIG. 1A, after forming a resist pattern 3 on a processing surface (of a base) 5, a resist pattern improving material 1 is applied (coated) to a surface of the resist pattern 3 to form a coating film. Thereafter, baking (heating and drying) may be performed, if necessary. As a result, the resist pattern improving material 1 is mixed with the resist pattern 3 (the resist pattern 3 is impregnated with the resist pattern improving material 1) at the interface between the resist pattern 3 and the resist pattern improving material 1, to thereby form a surface layer (a mixing layer) 10a by reacting the mixed (impregnated) portion at an interface between an inner resist pattern 10b (the resist pattern 3) and the resist pattern improving material 1, as illustrated in FIG. 1B. This occurs due to the penetration of the resist pattern improving material into the resist pattern 3 with a surface active effect of the benzalkonium chloride contained therein, and due to the reaction of polar groups. As a result, the roughness of side walls of the inner resist pattern 10b (resist pattern 3) is stably and uniformly reduced regardless of the size of the inner resist pattern 10b (resist pattern 3).

Figure 1C:
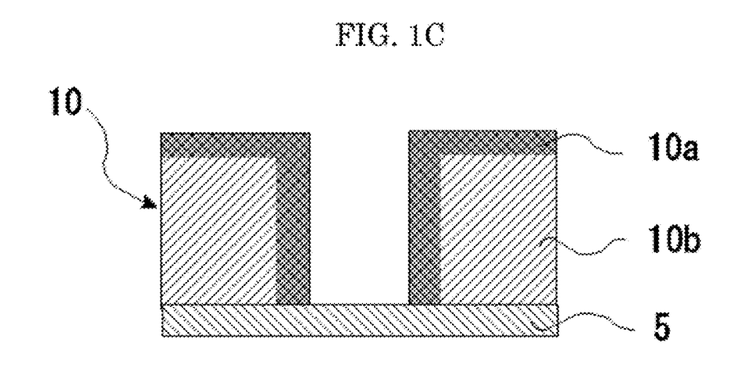
FIG. 1C is a diagram for explaining a mechanism for improving (reducing) LWR of a resist pattern using the disclosed resist pattern improving material, and illustrates the state where the surface of the resist pattern is improved with the resist pattern improving material.

Thereafter, as illustrated in FIG. 1C, the portion of the applied the resist pattern improving material 1 where the resist pattern improving material 1 is not interacted (mixed) with the resist pattern 3, and/or the portion of the applied the resist pattern improving material 1 where the interaction (mixing) between the resist pattern improving material 1 and the resist pattern 3 is weak (i.e. highly water-soluble portion) is dissolved and removed by rinsing, to thereby form (develop) a smooth resist pattern 10 in which the roughness of side walls thereof has been reduced.

Note that, the rinsing may be performed with pure water, or an alkaline solution such as a common alkaline developer. Moreover, pure water or an alkaline solution (e.g. an alkaline developer) to which a surfactant is added may be used for rinsing, if necessary. Note that, the rinsing is performed as necessity, and may not be performed.

The resist pattern 10 whose roughness has been reduced contains the surface layer (mixing layer) 10a, which is formed by reacting with the resist pattern improving material 1, on the surface of the inner resist pattern 10b (resist pattern 3). The resist pattern 10 whose roughness has been reduced has the roughness which has been reduced by the portion of the surface layer (mixing layer) 10a, compared to the resist pattern 3. Therefore, the line width roughness (LWR) value thereof, which represents a variation (unevenness) of line widths of a resist pattern formed by the roughness-reduced resist pattern 10, is smaller than the variation of line widths of the resist pattern formed by the resist pattern 3 before the reduction of the roughness. Accordingly, a precise resist pattern can be highly accurately formed by extending the exposure limit (dissolution limit) of the light source of the exposure device used for forming the resist pattern 3.

In the case where the resist pattern improving material 1 contains the water-soluble resin, a surface layer (mixing layer) 10a formed with the resist pattern improving material is larger than that formed with the resist pattern improving material without containing the water-soluble resin. Since the roughness-reduced resist pattern 10 has a roughness reduced by the portion of the surface layer (mixing layer) 10a compared to the resist pattern 3, and also has been thickened with the resist pattern improving material, the line width roughness (LWR) value thereof, which represents the variation (unevenness) in the line width of the resist pattern formed by the roughness-reduced resist pattern 10, is much smaller than the variation in the line width of the resist pattern 3 before the reduction of the roughness.

The disclosed resist pattern improving material is suitably used for highly accurately and smoothly forming a resist pattern by reducing roughness of side walls of the resist pattern, and exceeding the limits of an exposure device, or the limit of the smoothness due to the resist material. Moreover, the resist pattern improving material is particularly suitably used in the disclosed method for producing a semiconductor device.

(Method for Forming Resist Pattern)

The method for forming a resist pattern contains at least applying the resist pattern improving material (a coating step), a heating (baking) step and a rinsing step, and may further contain other steps such as an exposure step, if necessary.

<Coating Step>

The coating step is appropriately selected depending on the intended purpose without any restriction, provided that the coating step is, after forming applying a resist material on a processing surface, exposing the resist material with light, and developing the resist material to form a resist pattern, applying a resist pattern improving material so as to cover a surface of the resist pattern.

The resist material is appropriately selected depending on the intended purpose without any restriction, and examples thereof include the resist material described during the explanations of the resist pattern improving material.

The resist pattern can be formed in accordance with any of the conventional methods known in the art.

The resist pattern can be formed on a processing surface (of a base). The processing surface (of the base) is appropriately selected depending on the intended purpose without any restriction. In the case where the resist pattern is formed in the course of production of a semiconductor device, examples of the processing surface (of the base) include a surface of a semiconductor substrate. As the semiconductor substrate, substrates such as silicon wafers, and various oxidized films are preferable.

The processing surface (base) is preferably formed of an interlayer insulating material having a dielectric constant of 2.7 or lower.

The conditions for the exposing and developing are appropriately selected depending on the intended purpose without any restriction.

After the developing, rinsing may be performed or not performed prior to apply the resist pattern improving material. The rinsing fluid used for the rinsing is appropriately selected depending on the intended purpose without any restriction. The rinsing fluid may contain pure water, or an alkali developing solution. Moreover, it is also possible that the rinsing fluid contains a surfactant, but the rinsing fluid is preferably pure water in view of easiness of the process.

The method for applying the resist pattern improving material is appropriately selected from coating methods known in the art depending on the intended purpose without any restriction. For example, spin coating is preferable.

In the case of the spin coating, the revolution speed thereof is appropriately adjusted depending on the intended purpose without any restriction, but it is preferably 100 rpm to 10,000 rpm, more preferably 500 rpm to 5,000 rpm. The duration for the coating is preferably 1 second to 10 minutes, more preferably 1 second to 90 seconds.

At the time of the application, the applied thickness of the resist pattern improving material is generally approximately 5 nm to approximately 1,000 nm, preferably approximately 10 nm to approximately 100 nm.

<Heating (Baking) Step>

The heating (baking) step is appropriately selected depending on the intended purpose without any restriction, provided that the heating is performed at the conditions that will not soften the resist pattern.

The condition, method, and the like of the baking (heating and drying) are appropriately selected depending on the intended purpose without any restriction, provided that the resist pattern is not softened by the baking. The heating temperature is for example 40° C. to 150° C. The number of the baking to be performed may be once, or twice or more. In the case where the baking is performed twice or more, the temperature of the baking may be constant or different each time. In the case where the temperature is constant, the temperature is preferably 40° C. to 150° C., more preferably 60° C. to 120° C., and the duration is preferably 10 seconds to 5 minutes, more preferably 30 seconds to 100 seconds.

By performing the heating, mixing (penetration) of the resist pattern improving material into the resist pattern can be efficiently induced at an interface between the resist pattern and the resist pattern improving material.

<Rinsing Step>

The rinsing step is appropriately selected depending on the intended purpose without any restriction, provided that it is performed with a rinsing fluid.

By performing the rinsing after the application of the resist pattern improving material, a portion where the resist pattern improving material has not been interacted (mixed) with the resist pattern, or a portion where the interaction between the resist pattern improving material and the material of the resist pattern is weak is made dissolved and removed (rinsing processed) so that the resist pattern whose roughness of side walls is reduced can be developed (obtained).

The rinsing fluid is appropriately selected depending on the intended purpose without any restriction, and it may contain pure water, or an alkaline developer. Moreover, the rinsing fluid may further contain a surfactant, but the rinsing fluid is preferably pure water in view of the easiness of the process.

In the case where pure water containing a surfactant or an alkaline solution (an alkaline developer) containing a surfactant is used, uniformity of the thickened effect at the interface between the resist pattern improving material and the resist pattern is improved within the entire processing surface, and the generation of residual substances or defects can be reduced.

The surfactant is appropriately selected depending on the intended purpose without any restriction, but it is preferably a nonionic surfactant as the nonionic surfactant does not contain a metal ion such as a sodium salt, and a potassium salt.

The nonionic surfactant is appropriately selected depending on the intended purpose without any restriction. Examples of the nonionic surfactant include a polyoxyethylene-polyoxypropylene condensate compound, a polyoxyalkylene alkyl ether compound, a polyoxyethylene alkyl ether compound, a polyoxyethylene derivative compound, a silicone compound, a sorbitan fatty acid ester compound, a glycerin fatty acid ester compound, an alcohol ethoxylate compound, and a phenol ethoxylate compound. These may be used independently or in combination. Note that, an ionic surfactant may be also used as long as it is a non-metal salt ionic surfactant.

An amount of the surfactant in the pure water or alkaline solution is appropriately adjusted depending on the intended purpose without any restriction, but it is preferably 0.001% by mass to 1% by mass, more preferably 0.05% by mass to 0.5% by mass.

When the amount thereof is smaller than 0.001% by mass, the effect obtained from the surfactant is insufficient. When the amount thereof is larger than 1% by mass, the solvency of the developer becomes excessive, and thus the developer may dissolve the resist pattern, which increases roughness of the side walls of the resist pattern, as well as generating the residual substances or defects due to the formation of bubbles.

The alkali developer is appropriately selected from alkaline developers conventionally used for the production of a semiconductor device, without any restriction. Preferable examples thereof include a quaternary ammonium hydroxide aqueous solution, and a chorine aqueous solution. These may be used independently or in combination. Among them, a tetramethylammonium hydroxide aqueous solution is preferable as it is inexpensive and readily available.

<Other Steps>

Examples of other steps include the exposure step.

—Exposure Step—

The exposure step is applying UV-rays or ionizing radiation to an entire surface of the resist pattern before applying the resist pattern improving material thereto.

Specifically, when the resist pattern having various pitches including the region where the resist pattern is spaced (the region where the resist pattern has a long pitch) and the region where the resist pattern is dense (the region where the resist pattern has a short pitch), or the resist pattern having various sizes of convex portions is processed, a light intensity distribution for exposure is different every pattern. The slight difference of the surface conditions (the difference in the fogging exposure value) in such a degree that will not be noticed by the developing of the resist pattern will affect as a difference in permeability of the resist pattern improving material to the resist pattern. As a result, it affects the formation of the mixing layer formed by the interaction between the resist pattern and the resist pattern improving material in terms of the easiness for the formation. When the entire surface of the resist pattern is exposed to the UV-ray or the ionizing radiation before the application of the resist pattern improving material, the surface conditions of the resist pattern are unified, and thus the permeability of the resist pattern improving material to the resist pattern can be unified without depending on the density or size of the resist pattern, which helps to effectively reduce the roughness of the side walls of the resist pattern, and to improve the uniformity of the resist pattern width.

The UV-ray and the ionizing radiation are appropriately selected depending on the sensitive wavelength range of the material of the resist pattern, without any restriction. Specific examples thereof include a broad band UV-ray emitted from a high pressure mercury lamp or low pressure mercury lamp, g-line (a wavelength of 436 nm), i-line (a wavelength of 365 nm), KrF excimer laser light (a wavelength of 248 nm), ArF excimer laser light (a wavelength of 193 nm), $F_2$ excimer laser light (a wavelength of 157 nm), EUV-ray (a soft X-ray region of a wavelength of 5 nm to 15 nm), an electron beam, and X-ray. Note that, among them, the one that is the same as the UV-ray or the ionizing radiation used for the exposure for forming the resist pattern is preferable in view of the structure of the production device.

The irradiation (the exposure dose) of the UV-ray or the ionizing radiation to the resist pattern is appropriately selected depending on the type of the UV-ray or the ionizing radiation for use without any restriction. For example, it is preferably 0.1% to 20% relative to the irradiation (the exposure dose) for the formation of the resist pattern.

When the irradiation is less than 0.1%, the surface conditions of the resist pattern may not be unified sufficiently. When the irradiation is more than 20%, the photoreaction is excessively induced in the resist pattern, and thus the upper portion of the resist pattern may be degraded in terms of the shape thereof, or the pattern may be partially lost.

The method for the exposure is not particularly restricted provided that the UV-ray or the ionizing radiation is applied at the constant irradiation in the range mentioned earlier. It is suitably adjusted and carried out in such a manner that the exposure of the strong light is carried out in a short period, the exposure of the weak light is carried out in a long period, the exposure to the highly sensitive resist material is carried out at the low exposure dose (irradiation), or the exposure to the resist material having low sensitivity is carried out at the high exposure dose (irradiation).

The method for forming the resist pattern is suitably for forming various patterns, such as a line-space pattern, a hole pattern (e.g. contact hole) and a trench (groove) pattern, and the resist pattern formed by the method for forming the resist pattern can be used as a mask pattern and a reticle pattern. Moreover, the method for forming the resist pattern can be suitably used for productions of metal plugs, various wirings, magnetic heads, liquid crystal displays (LCD), plasma display panels (PDP), functional parts such as a surface acoustic wave (SAW) filter, optical parts used for connections of optical wiring, precision parts such as a microactuator, and semiconductor devices. The method for forming the resist pattern is particularly suitably used in the disclosed method for producing a semiconductor device, which will be explained hereinafter.

(Method for Producing Semiconductor Device)

The disclosed method for producing a semiconductor device contains at least a resist pattern forming step, and a patterning step, and may further contain other steps, if necessary.

<Resist Pattern Forming Step>

The resist pattern forming step is applying the resist pattern improving material so as to cover a surface of a resist pattern; heating the applied resist pattern improving material and the resist pattern, and rinsing the heated resist pattern improving material and resist pattern, where the resist pattern is formed by applying a resist material onto a processing surface, exposing the resist material to light, and developing the exposed resist material to pattern the resist material to thereby form the resist pattern. As a result of the resist pattern forming step, a resist pattern in which the roughness of side walls of the resist pattern is reduced and uniformity of the resist pattern width is improved can be formed on the processing surface.

The details of the resist pattern forming step are the same as those of the method for forming a resist pattern. Namely, the applying is identical to the applying step in the method for forming a resist pattern, the heating is identical to the heating step in the method for forming a resist pattern, and the rinsing is identical to the rinsing step in the method for producing a resist pattern.

Examples of the processing surface include surface layers of various members in a semiconductor device, but among them, a substrate or a surface of a substrate (e.g. silicon wafer), various oxidized films, metal films, and semiconductor films are preferable.

<Patterning Step>

The patterning step is etching the processing surface using the resist pattern formed in the resist pattern forming step as a mask (as a mask pattern) to pattern the processing surface.

The method of the etching is appropriately selected from methods known in the art depending on the intended purpose without any restriction, but it is preferably dry etching. The conditions of the etching are appropriately selected depending on the intended purpose without any restriction.

According to the disclosed method for producing a semiconductor device, various semiconductor devices, such as a flash memory, DRAM, and FRAM can be efficiently produced.

The disclosed resist pattern improving material can reduce LWR of a resist pattern without changing the size of the resist pattern more than necessary. Moreover, by using the disclosed resist pattern improving material, a fine resist pattern can be formed by exceeding exposure limits of light sources of the conventional exposure devices.

The disclosed method for forming a resist pattern can provide a resist pattern whose LWR has been improved, without changing the size of the resist pattern more than necessary. Moreover, by the disclosed method, a fine resist pattern can be formed by exceeding exposure limits of light sources of the conventional exposure devices.

The disclosed method for producing a semiconductor device can produce a high performance semiconductor having a fine wiring pattern formed by using a fine resist pattern which exceeds the exposure limit of a light source of a conventional exposure device, and the LWR of which has been improved.

The disclosed semiconductor device can provide a highly precise semiconductor device having a fine wiring pattern.

EXAMPLES

The present invention will be more specifically explained with reference to Examples, but these Examples shall not be construed as limiting to the scopes of the claims in any way.

Example 1

Experiment with Baking

—Preparation of Resist Pattern Improving Material—

The resist pattern improving materials A to N and comparative materials a to e each having the respective formulation presented in Table 1 were prepared.

Note that, in Table 1, "A" to "N", and "a" to "e" are corresponded to the resist pattern improving materials A to N, and the comparative materials a to e, respectively. The units for the numbers presented in brackets of Table 1 are "mass (g)."

"Benzalkonium chloride" of the resist pattern improving materials A to N were those of Wako Pure Chemical Industries, Ltd. The benzalkonium chloride consisted of molecules having n of 8 to 18, mainly consisted of molecules having n of 12 and 15 in the general formula (1).

In Table 1, "Resin" denotes a water-soluble resin, "PVA" denotes polyvinyl alcohol (PVA-205C, manufactured by Kuraray Co., Ltd.), and "PVPd" denotes polyvinyl pyrrolidone (K=30, manufactured by Kanto Chemical Co., Inc.), and "PGA" denotes polyglutamic acid (molecular weight: about 1,500,000, non-crosslinked type, manufactured by Yakult Pharmaceutical Industry Co., Ltd.). In the column "Others," "IPA" denotes isopropyl alcohol, "2HBA" denotes 2-hydroxybenzyl alcohol, and "TN-80" denotes a nonionic surfactant (primary alcohol ethoxylate surfactant, manufactured by ADEKA CORPORATION).

The used benzethonium chloride, and cetylpyridinium chloride are represented by the following structural formulae:

Benzethonium Chloride

Cetylpyridinium Chloride

Moreover, as water, pure water (deionized water) was used, and an amount of the water was 100 g in each formulation.

TABLE 1

| Material | Benzalkonium chloride | Resin | Others |
|---|---|---|---|
| A | (0.05) | — | — |
| B | (0.1) | — | — |
| C | (0.5) | — | — |
| D | (0.1) | — | TN-80 (0.003) |
| E | (0.1) | — | IPA (1) |
| F | (0.1) | PVA (0.1) | — |
| G | (0.01) | PVA (0.1) | — |
| H | (0.1) | PVA (0.5) | — |
| I | (0.1) | PVA (1) | — |
| J | (0.1) | PVPd (1) | — |
| K | (0.1) | PVPd (1) | γ-butyrolactone (0.5) |
| L | (0.1) | PVPd (1) | propylene glycol monomethyl ether (0.1) |
| M | (0.1) | PGA (1) | — |
| N | (0.005) | PVA (1) | 2HBA (0.02), TN-80 (0.006) |
| a | — | PVA (4) | 2HBA (1), TN-80 (0.06) |
| b | — | PVA (1) | 2HBA (0.02), TN-80 (0.003) |
| c | — | PVA (1) | — |

TABLE 1-continued

| Material | Benzalkonium chloride | Resin | Others |
|---|---|---|---|
| d | — | — | benzethonium chloride (0.1) |
| e | — | — | cetylpyridinium chloride (0.1) |

—Formation of Resist Pattern—

The prepared materials (resist pattern improving materials and comparative materials) were each applied onto a line-space pattern, which was formed of an alicyclic ArF resist (manufactured by TOKYO OHKA KOGYO CO., LTD.) and had a width of 96 nm (pitch: 180 nm) and LWR of 6.6 nm (corresponding to "unprocessed" in Table 2), by spin coating initially at 850 rpm for 5 seconds, followed by at 2,000 rpm for 40 seconds. Thereafter, baking was performed at 110° C. for 60 seconds, and the resulting material was rinsed with pure water for 60 seconds to thereby remove unreacted portions where interactions (mixing) did not occur. In this manner, fine patterns were formed using the resist pattern improving materials A to N, and comparative materials a to e.

Note that, the forming conditions of the used line-space pattern were as follows. Namely, the resist was subjected to exposure by an ArF scanner (of Canon Inc.), and post exposure baking was performed on the resulting resist by a track device (of Tokyo Electron Limited) connected to the scanner. Subsequently, the baked material was developed with a 2.38% by mass tetramethyl ammonium hydroxide developer for 20 seconds, followed by rinsed with pure water.

A line width size of the obtained resist line pattern ("size after processing" in Table 2), changed amount in the size of the line width ("amount of change" in Table 2), variations in the line pattern width ("LWR" in Table 2) and an improvement rate of LWR (%) are presented in Table 2. In Table 2, "A" to "N" and "a" to "e" are corresponded to the resist pattern improving materials A to N, and comparative materials a to e, respectively.

Note that, the line width is an average value of the measured values of the line width at 6 points within the area observed by means of CD SEM. Moreover, LWR was obtained by tripling the standard deviation (a) of the variation of the measured values of the line width at 25 points within the approximately 720 nm-length region. Furthermore, the ratio of the improved amount in the value of LWR after processing with respect to the value of LWR of the unprocessed pattern was obtained from the following equitation, and this ratio was determined as "LWR improvement rate (%)".

$$LWR \text{ improvement rate}(\%) = [(LWR \text{ of unprocessed pattern} - LWR \text{ after processing})/(LWR \text{ of unprocessed pattern})] \times 100$$

TABLE 2

| Material | Size after processing (nm) | Amount of change in size (nm) | LWR (3σ, nm) | LWR improvement rate (%) |
|---|---|---|---|---|
| Unprocessed | 96 | — | 6.6 | — |
| A | 97 | 1 | 5.0 | 24 |
| B | 97 | 1 | 4.1 | 37 |
| C | 93 | −3 | 3.5 | 47 |
| D | 98 | 2 | 3.9 | 41 |
| E | 97 | 1 | 4.0 | 39 |
| F | 98 | 2 | 5.2 | 21 |
| G | 98 | 2 | 5.7 | 14 |
| H | 98 | 2 | 5.1 | 23 |
| I | 98 | 2 | 4.5 | 32 |
| J | 98 | 2 | 5.6 | 14 |
| K | 98 | 2 | 5.2 | 21 |
| L | 94 | −2 | 5.5 | 17 |
| M | 97 | 1 | 6.0 | 9 |
| N | 98 | 2 | 5.7 | 14 |
| a | 127 | 31 | 5.6 | 15 |
| b | 103 | 7 | 6.1 | 8 |
| c | Could not apply | — | — | — |
| d | 98 | 2 | 7.1 | LWR degraded |
| e | 100 | 4 | 5.6 | 15 |

It can be confirmed from Table 2 that use of the resist pattern improving materials A to N each containing the benzalkonium chloride represented by the general formula (1) could improve uniformity of the widths in the resist pattern, i.e. reducing the LWR value without significantly changing the line width of the resist pattern, compared to the comparative materials a to b which did not include benzalkonium chloride. Moreover, in the case where benzethonium chloride (comparative material d), which was a quaternary ammonium salt likewise the benzalkonium chloride, was used, the LWR was degraded. In the case where cetylpyridinium chloride (comparative material e), which was a quaternary ammonium salt likewise the benzalkonium chloride, was used, the LWR improved by 15%, but the line width increased by 4 nm. Accordingly, it was confirmed that the comparative material 3 had a little effect of reducing the LWR without changing the size of the resist pattern.

<Experiment without Baking>

The resist pattern improving material B prepared in Example 1 was applied onto a line pattern (corresponding to "unprocessed" in Table 3), which had been formed of an alicyclic ArF resist (manufactured by TOKYO OHKA KOGYO CO., LTD.) in the same manner as in Experiment with baking, and had a width of 96 nm, and LWR of 6.6 nm, by spin coating initially at 850 rpm for 5 seconds, followed by 2,000 rpm for 40 seconds. Subsequently, without performing baking, the resulting resist pattern improving material was rinsed with pure water for 60 seconds to remove unreacted portions where interactions (mixing) did not occur. In this manner, a fine pattern was formed.

The obtained resist pattern was evaluated in the same manner as in Experiment with baking. The results are depicted in Table 3.

TABLE 3

| Material | Size after processing (nm) | Amount of change in size (nm) | LWR (3σ, nm) | LWR improvement rate (%) |
|---|---|---|---|---|
| Unprocessed | 96 | — | 6.6 | — |
| B | 98 | 2 | 7.2 | LWR degraded |

It can be confirmed from Table 3 that the resist pattern improving material B containing the benzalkonium chloride represented by the general formula (1) did not exhibit an effect of reducing LWR, in the case where it was rinsed after coating, without performing baking.

<Application Experiment of Rinsing Fluid During Formation of Resist Pattern>

A resist pattern was formed, baked, and developed in the same manner as in Experiment with baking by using the same materials and devices under the same conditions. Specifically, an alicyclic ArF resist (manufactured by TOKYO OHKA KOGYO CO., LTD.) was used, and was subjected to exposure by an ArF scanner (of Canon Inc.), and post exposure baking was performed on the resulting resist by a track device (of Tokyo Electron Limited) connected to the scanner. Subsequently, the baked material was developed with a 2.38% by mass tetramethyl ammonium hydroxide developer for 20 seconds. The conditions so far were the same as the conditions for forming the resist pattern in Experiment with baking.

Thereafter, reductions of LWR were compared in two processing methods. Specifically, a case (a processing method X) where rinsing with water was performed directly after processing the resist pattern with the resist pattern improving material B without baking, instead of performing rinsing with water after the developing, which was generally performed, was compared with a case (a processing method Y) where baking was performed at 110° C. for 60 seconds after processing the resist pattern with the resist pattern improving material B, followed by rinsing with water, instead of performing rinsing with water after the developing. The results are depicted in Table 4.

TABLE 4

| Material | Processing method | Size after processing (nm) | Among of change in size (nm) | LWR (3σ, nm) | LWR improvement rate (%) |
|---|---|---|---|---|---|
| Unprocessed | General developing process | 96 | — | 6.6 | — |
| B | Same as B of Table 2 | 97 | 1 | 4.1 | 37 |
| B | X (without baking) | 98 | 2 | 8.0 | LWR degraded |
| B | Y (with baking) | 96 | 0 | 4.0 | 39 |

It was found from Table 4 that in the case (the processing method X) where the baking was not performed, the LWR increased (i.e. LWR was degraded) similarly to the results depicted in Table 3, even though the resist pattern improving material containing the benzalkonium chloride represented by the general formula (1) was used as a rinsing fluid for the developer during the formation of the resist pattern. Moreover, it was found that in the case (the processing method Y) where the baking was performed, the high effect of reducing LWR was exhibited similarly to the results depicted in Table 1.

Example 2

Production of Semiconductor Device

Figure 2A:
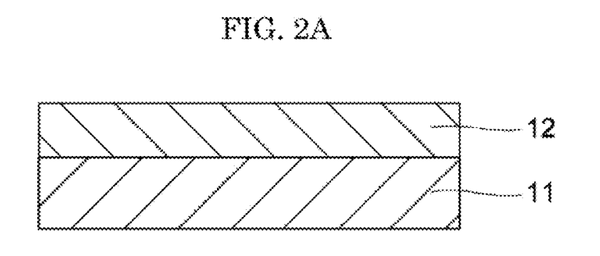
FIG. 2A is a schematic diagram for explaining one example of the disclosed method for producing a semiconductor device, and illustrates the state where an interlayer insulating film is formed on a silicon substrate.
Figure 2B:
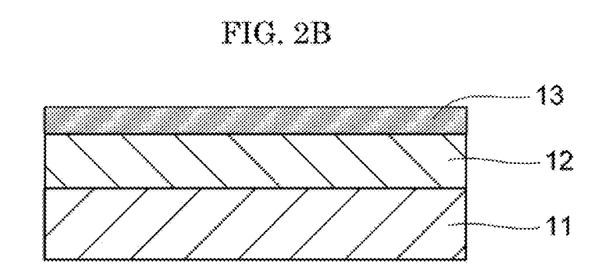
FIG. 2B is a schematic diagram for explaining one example of the disclosed method for producing a semiconductor device, and illustrates the state where a titanium film is formed on the interlayer insulating film of FIG. 2A.
Figure 2C:
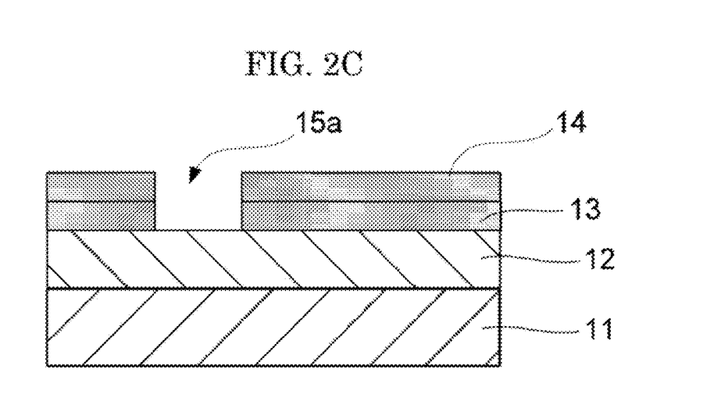
FIG. 2C is a schematic diagram for explaining one example of the disclosed method for producing a semiconductor device, and illustrates the state where a resist film is formed on the titanium film and a hole pattern is formed in the titanium film.
Figure 2D:
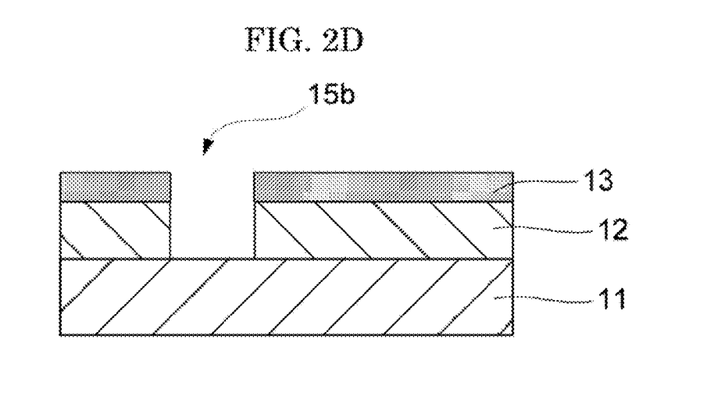
FIG. 2D is a schematic diagram for explaining one example of the disclosed method for producing a semiconductor device, and illustrates the state where a hole pattern is also formed in the interlayer insulating film.

An interlayer insulating film 12 was formed on a silicon substrate 11 as illustrated in FIG. 2A, and a titanium film 13 was formed on the interlayer insulating film 12 by sputtering as illustrated in FIG. 2B. Next, as illustrated in FIG. 2C, a resist pattern was formed by ArF liquid immersion lithography, followed by applying the disclosed resist pattern improving material B to the resist pattern. Thereafter, baking was performed, and rinsing was then performed with pure water, to thereby form a smooth resist pattern 14 whose LWR value had been reduced. Using the resist pattern 14 as a mask, the titanium film 13 was patterned by reactive ion etching to form an opening 15a. Sequentially, as illustrated in FIG. 2D, an opening 15b was formed in the interlayer insulating film 12 using the titanium film 13 as a mask, as well as removing the resist pattern 14 by reactive ion etching.

Figure 2E:
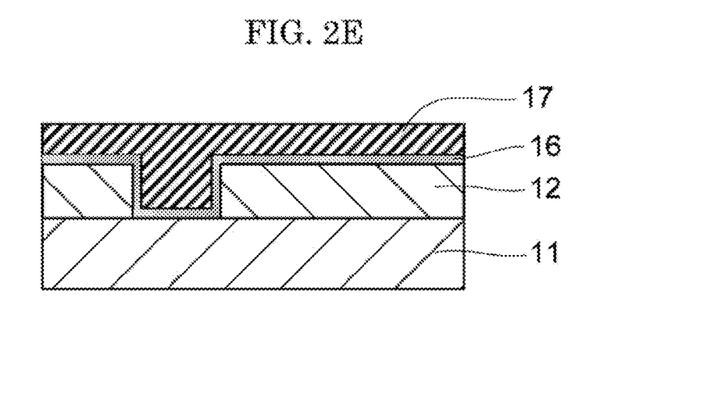
FIG. 2E is a schematic diagram for explaining one example of the disclosed method for producing a semiconductor device, and illustrates the state where a Cu film is formed on the interlayer insulating film in which the hole pattern has been formed.
Figure 2F:
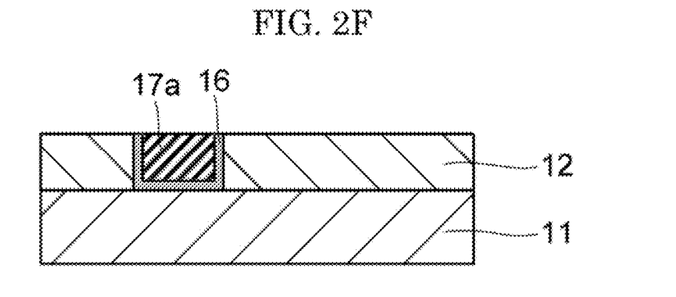
FIG. 2F is a schematic diagram for explaining one example of the disclosed method for producing a' semiconductor device, and illustrates the state where the Cu deposited on the area of the interlayer insulating film where the hole pattern has not been provided is removed.

Next, the titanium film 13 was removed by a wet treatment, and a TiN film 16 was formed on the interlayer insulating film 12 by sputtering as illustrated in FIG. 2E, followed by forming a Cu film 17 on the TiN film 16 by electroplating. Thereafter, as illustrated in FIG. 2F, the surface was flattened by chemical-mechanical polishing (CMP) so as to leave the barrier metal and the Cu film (first metal film) in the groove corresponded to the opening 15b (FIG. 2D) to thereby form a first layer wiring 17a.

Figure 2G:
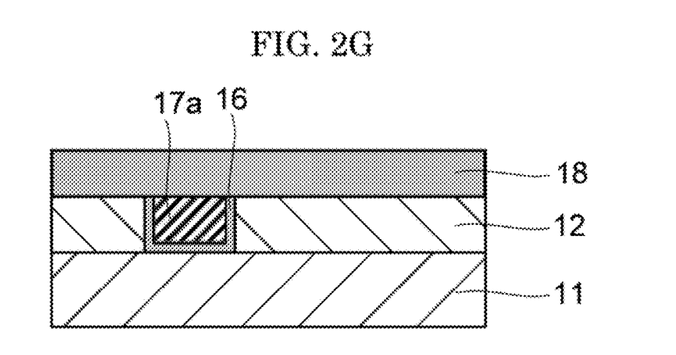
FIG. 2G is a schematic diagram for explaining one example of the disclosed method for producing a semiconductor device, and illustrates the state where an interlayer insulating film is formed on a Cu plug, which has been formed in the hole pattern, and on the interlayer insulating film.
Figure 2H:
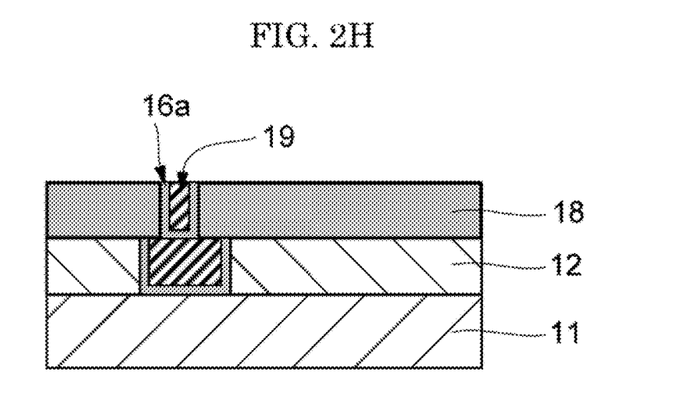
FIG. 2H is a schematic diagram for explaining one example of the disclosed method for producing a semiconductor device, and illustrates the state where a hole pattern is formed in the interlayer insulating film serving as a surface layer, and a Cu plug is formed.

Then, as illustrated in FIG. 2G, after forming an interlayer insulating film 18 on the first layer wiring 17a, as illustrated in FIG. 2H, a Cu plug (a second metal film) 19 for connecting the first layer wiring 17a with an upper layer wiring mentioned later, and a TiN film 16a were formed in the same manner illustrated in FIGS. 2A to 2F.

Figure 2I:
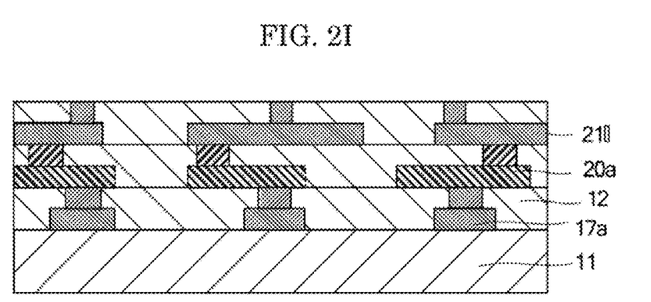
FIG. 2I is a schematic diagram for explaining one example of the disclosed method for producing a semiconductor device and illustrates the state where a wiring of three-layer structure is formed.

By repeating each steps, as illustrated in FIG. 2I, a semiconductor device having a multilayer-wiring structure including the first layer wiring 17a, the second layer wiring 20a and the third layer wiring 21a above the silicon substrate 11 was produced. Note that, in FIG. 2I, the barrier metal layer formed below each layer wiring is not illustrated.

In Example 2, the resist pattern 14 was a resist pattern formed by using the disclosed resist pattern improving material.

The disclosed resist pattern improving material can be suitably used for forming a fine pattern by exceeding the exposure limit of light for use, because the resist pattern improving material can improve the uniformity of the resist pattern width by reducing roughness of side walls of the resist pattern formed of an ArF resist, a resist for ArF liquid immersion lithography, or the like, and the resist pattern improving material can be suitably used for various patterning methods, production methods of semiconductor devices, and the like. Moreover, the resist pattern improving material can be particularly preferably used in the disclosed method for forming a resist pattern, and the disclosed method for producing a semiconductor device.

The disclosed method for producing a semiconductor device can be suitably used in productions of various semiconductor devices, and magnetic disk devices, such as flash memories, DRAMs, FRAMs, HDD heads, and SWA filters.

The disclosed semiconductor device is suitable for various semiconductor devices, and magnetic disk devices, such as flash memories, DRAMs, FRAMs, HDD heads, and SWA filters.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

What is claimed is:

1. A method for forming a resist pattern, comprising:

applying a resist pattern improving material so as to cover a surface of a resist pattern to thicken the resist pattern;

heating the applied resist pattern improving material and the resist pattern at a temperature of 40° C. to 150° C.; and rinsing the heated resist pattern improving material and the resist pattern with a rinsing fluid containing water, wherein the resist pattern is formed by applying a resist material to a processing surface, exposing the applied resist material to light, and developing the exposed resist material to pattern the resist material, and wherein the resist pattern improving material contains water, and benzalkonium chloride represented by the following formula (1):

General Formula (1)

where n is an integer of 8 to 18.

2. A method for producing a semiconductor device, comprising:

applying a resist pattern improving material so as to cover a surface of a resist pattern formed on a processing surface to thicken the resist pattern;

heating the applied resist pattern improving material and the resist pattern at a temperature of 40° C. to 150° C.;

rinsing the heated resist pattern improving material and the resist pattern with a rinsing fluid containing water to form the improved resist pattern; and etching the processing surface using the improved resist pattern as a mask to pattern the processing surface, wherein the resist pattern is formed by applying a resist material to the processing surface, exposing the applied resist material to light, and developing the exposed resist material to pattern the resist material, and wherein the resist pattern improving material contains water, and benzalkonium chloride represented by the following formula (1):

General Formula (1)

where n is an integer of 8 to 18.

3. The method for producing a semiconductor device according to claim 2, wherein the etching is dry etching.

4. The method for producing a semiconductor device according to claim 2, wherein the processing surface is formed of an interlayer insulating material having dielectric constant of 2.7 or lower.

5. The method for forming a resist pattern according to claim 1, wherein the resist pattern improving material contains a polyglutamic acid.

6. The method for producing a semiconductor device according to claim 2, wherein the resist pattern improving material contains a polyglutamic acid.

* * * * *